United States Patent [19]

Hammer

[11] Patent Number: 5,051,790
[45] Date of Patent: Sep. 24, 1991

[54] OPTOELECTRONIC INTERCONNECTIONS FOR INTEGRATED CIRCUITS

[75] Inventor: Jacob M. Hammer, Princeton, N.J.

[73] Assignee: David Sarnoff Research Center, Inc., Princeton, N.J.

[21] Appl. No.: 455,194

[22] Filed: Dec. 22, 1989

[51] Int. Cl.$^5$ .................... H01L 31/00; H01L 33/00
[52] U.S. Cl. ........................ 357/19; 357/30; 357/74; 372/50; 385/37; 385/42
[58] Field of Search ............ 357/19, 74, 30; 372/50; 350/96.15

[56] References Cited

U.S. PATENT DOCUMENTS

| | | | |
|---|---|---|---|
| 3,985,423 | 10/1976 | Tseng | 350/96 WG |
| 4,118,633 | 10/1978 | Guilleman et al. | 357/19 |
| 4,194,162 | 3/1980 | Uematsu | 357/19 |
| 4,445,759 | 5/1984 | Valette | 350/96.12 |
| 4,703,219 | 10/1987 | Mesquida | 357/17 |
| 4,758,062 | 7/1988 | Sunagawa et al. | 350/96.19 |

FOREIGN PATENT DOCUMENTS

| | | | |
|---|---|---|---|
| 61-208276 | 9/1986 | Japan | 357/30 |
| 1-84753 | 3/1989 | Japan | 357/19 |
| 1-84755 | 3/1989 | Japan | 357/19 |

OTHER PUBLICATIONS

B. Broberg et al., "Widely Tunable Active Bragg Reflector Integrated Lasers InGaAsP-InP", *Applied Physics Letters*, vol. 52(16) Apr. 18, 1988.

G. Evans et al., "Two-Dimensional Coherent Laser Arrays Using Grating Surface Emission", *IEEE Journal of Quantum Electronics*, vol. 25, No. 6, Jun. 1989, pp. 1525-1537.

Fan et al., *Material Research Society Symposium Proceedings*, vol. 91, pp. 15-30, Apr. 21-23, 1987, "Heteroepitaxy on Silicon".

Goodman et al., *Proceedings of the IEEE*, vol. 72, No. 7, Jul. 1984, pp. 850-866, "Optical Interconnections for VLST".

Subbarao et al., *GaAs IC Symposium Technical Digest*, San Diego, Calif., Oct. 22-25, 1989, pp. 163-166, "Monolithic PIN Photodetector and FET Amplifier on GaAs-on-Si".

Primary Examiner—Jerome Jackson, Jr.
Attorney, Agent, or Firm—W. J. Burke

[57] ABSTRACT

The optoelectronic interconnection of the present invention provides a means for interconnecting a plurality of integrated circuits and each having at least one termination. The termination includes a transmitting section and a receiving section. Each transmitting section includes means for converting an output electrical signal from the integrated circuit to an optical signal in the form of a beam and an output grating for emitting the optical beam from the integrated circuit. Each receiving section includes an input grating for receiving an input optical signal in the form of a beam, means for amplifying the optical signal and a photodetector for converting the optical signal to an electrical signal which is fed to the circuit. The integrated circuits may be mounted adjacent each other with the output signals being emitting from the integrated circuits in the same direction. A reflector is mounted over the integrated circuits to reflect an output signal beam from the transmitting section of one integrated circuit to the receiving section of another integrated circuit. Each of the transmitting sections is capable of varying the angle at which the output signal beam is emitted therefrom so as to varying the integrated circuit to which the beam is reflected.

18 Claims, 3 Drawing Sheets

OPTOELECTRONIC INTERCONNECTIONS FOR INTEGRATED CIRCUITS

FIELD OF THE INVENTION

The present invention relates to an optical interconnection between integrated circuits, and, more particularly, to an interconnection between integrated circuits in which an electrical signal in one integrated circuit is converted to an optical signal which is transmitted to a second integrated circuit where it is converted back to an electrical signal in the second integrated circuit.

BACKGROUND OF THE INVENTION

Integrated circuits typically comprise a body of a semiconductor material, such as single crystalline silicon, having therein a plurality of electrical components, such as transistors, diodes, resistors, and the like, arranged and connected together to form a desired circuit. Along the edges of the body are conductive terminal pads to which the integrated circuit is connected. The terminal pads are connected to terminals by which the integrated circuit is electrically connected to other integrated circuits, other electrical components and/or a source of power. The integrated circuit is generally mounted in a protective housing having the terminals projecting therefrom. The terminal pads are connected to the terminals by means of fine wires which are bonded at one end to the terminal pads and at the other ends to the terminals.

As the integrated circuits become more complex and larger, they require a greater number of terminal pads and connections to terminals. Integrated circuits have been developed which include one hundred or more terminal pads and terminals. Such integrated circuits are more difficult to terminate in that they require such a great number of wire bondings which are arranged very close to each other. Also, they become more susceptible to being damaged since the breaking of any one wire can disrupt the entire circuit. Therefore, it would be desirable to have a termination for these large and complex integrated circuits which require fewer interconnections and is less susceptible to damage.

SUMMARY OF THE INVENTION

The present invention relates to an integrated circuit which includes a body of a semiconductor material having electrical components therein and electrically connected in a desired electrical circuit. On the body is a transmitting section having means for converting an output signal of the electrical circuit into an output optical signal and means for directing the optical output signal from the body. Also on the body is a receiving section having means for receiving an input optical signal and converting it to an input signal which is fed to the electrical circuit.

DETAILED DESCRIPTION OF PREFERRED EMBODIMENTS

Figure 1:
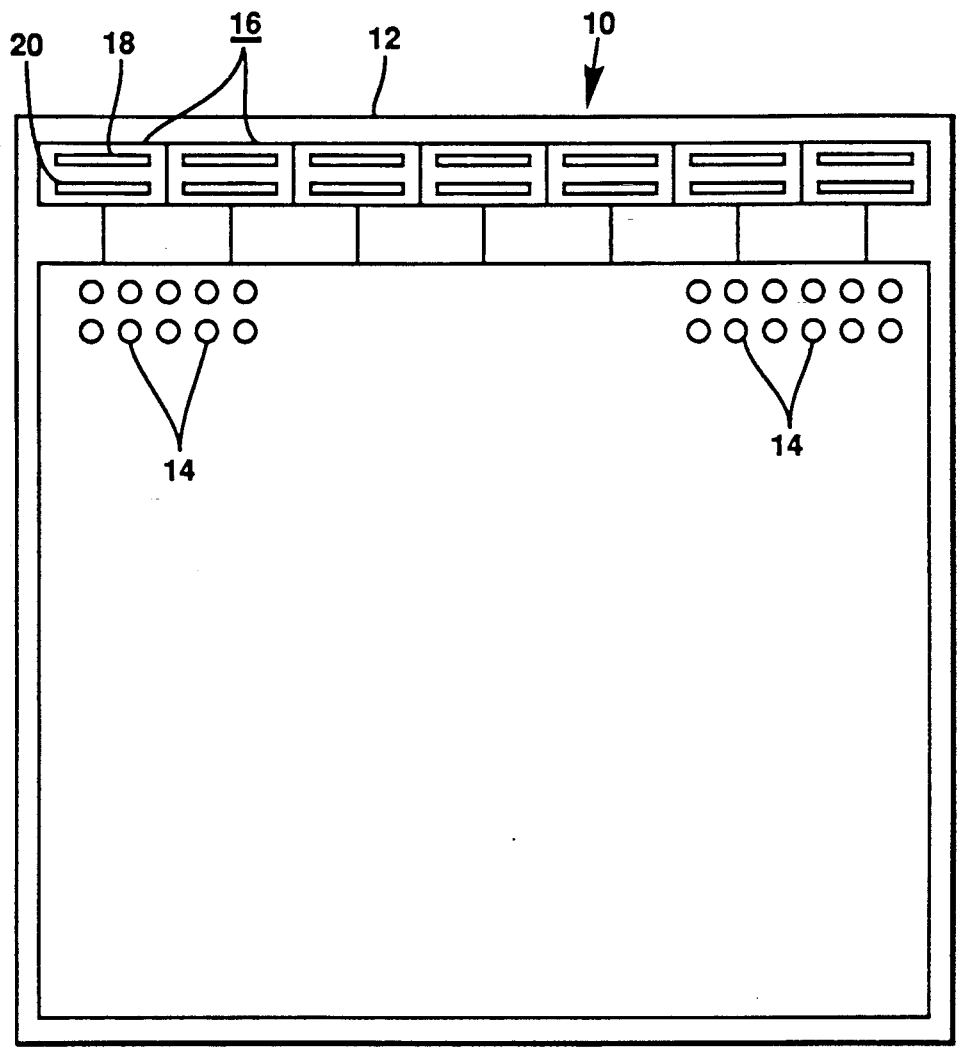
FIG. 1 is a top plan view of an integrated circuit having the optoelectronic termination of the present invention.

Referring initially to FIG. 1, there is shown an integrated circuit 10 which includes the optical termination of the present invention. Integrated circuit 10 comprises a body 12 of a semiconductor material, such as single crystalline silicon, having therein various electrical components 14, schematically indicated by circles, such as transistors of various kinds, diode, resistors, capacitors and the like. The electrical components 14 are electrically connected together to form one or more desired electrical circuits. Along one edge of the body 12 are a plurality of optical terminations 16. Each of the optical terminations 16 is electrically connected to portions of the circuit to allow electrical signals to be read out of the circuit and to be fed into the circuit. Each optical termination 16 is adapted to handle more than one input and/or output signal, and can handle as many as ten or more of the input and/or output signals using multiplexer/demultiplexer technology. Each of the optical terminations 16 includes a transmitting section 18 and a receiving section 20. The transmitting and receiving sections 18 and 20 are in a spaced relation and extend along the edge of the body 12, typically parallel to the edge. Each of the transmitting and receiving sections 18 and 20 may be as small as 0.1 centimeter (cm) in length and 50 micrometers in width.

Figure 2:
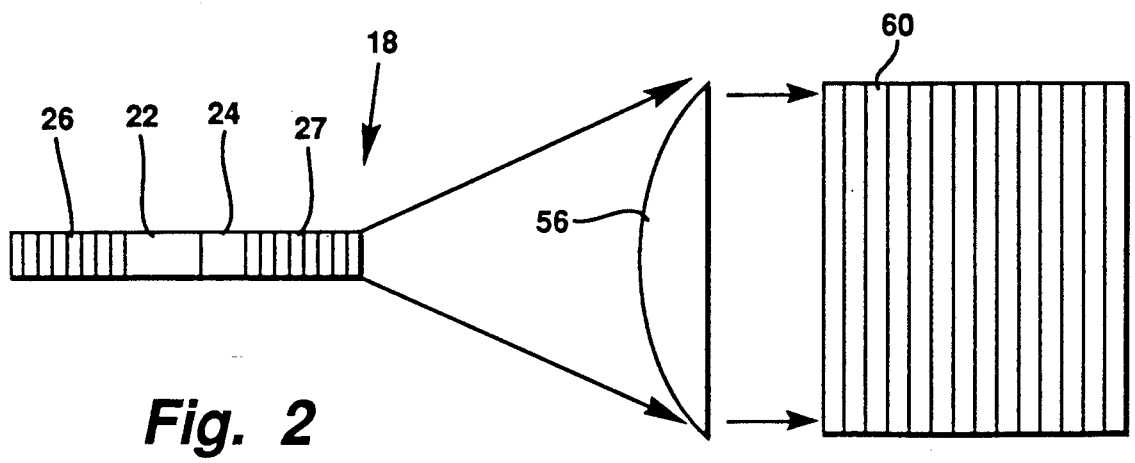
FIG. 2 is a top schematic view of the transmitting portion of the optoelectronic termination of the present invention.
Figure 3:
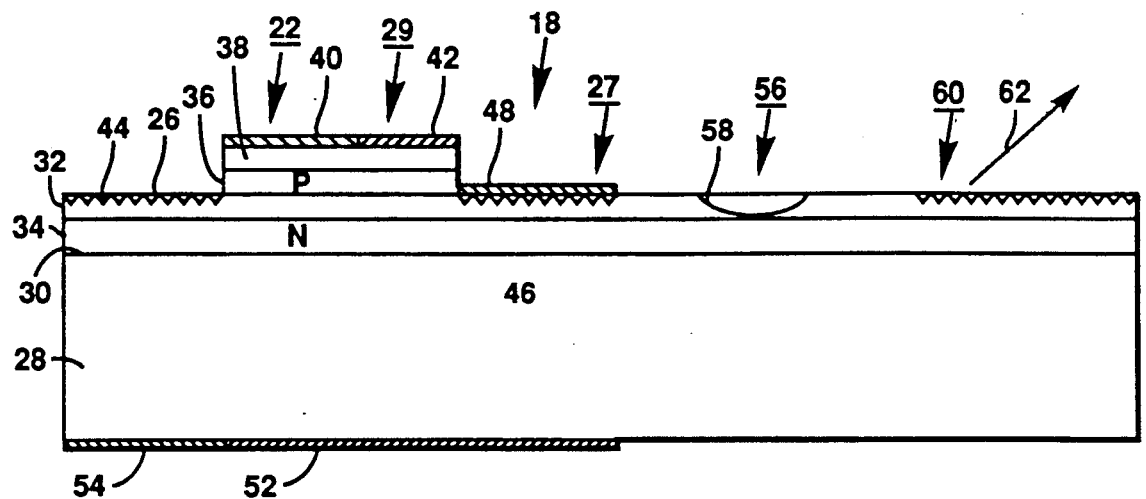
FIG. 3 is a sectional view of one form of the transmitting portion of the optoelectronic termination.

Referring to FIGS. 2 and 3, each transmitting section 18 comprises a gain section 22 in which light is generated, a phase control section 24 adjacent the gain section 22, and Bragg reflecting gratings 26 and 27 at opposite ends of the gain section 22. As shown in FIG. 3, the transmitting section 18 is formed in a substrate 28 of a semiconductor material, such as GaAs. Over a surface 30 of the substrate 28 is a waveguide layer 32 which may be of undoped GaAs. Between the waveguide layer 32 and the substrate surface 30 is a clad layer 34 of a semiconductor material, such as AlGaAs, of one conductivity type, such as N-type, having an energy band-gap higher than that of the waveguide layer. In the gain section 22 and the phase control section 24, a clad layer 36 of a semiconductor material of the opposite conductivity type, such as P-type, extends over the waveguide layer 32. The clad layer 36 is also of a semiconductor material, such as AlGaAs, having an energy band-gap higher than that of the waveguide layer 32. A capping layer 38 of a semiconductor material of the same conductivity type as the clad layer 36, such as P-type GaAs, extends over the clad layer 36. Separate metal contacts 40 and 42 are on the capping layer 38 over the gain section 22 and phase control section 24 respectively.

Each of the Bragg reflectors 26 and 27 is a grating formed by spaced, parallel groves 44 and 46 in the surface of the waveguide layer 32 and extending transversely across the waveguide layer 32. The grooves 44 and 46 of the Bragg reflector gratings 26 and 27 are of a number and dimension so as to reflect light passing thereunder. However, the Bragg reflector grating 27 adjacent the pulse control section 24 is only partially reflecting so that some of the light passing thereunder will pass therethrough. Separate metal contacts 48 and 50 extend over the Bragg reflector gratings 26 and 27 so as to permit tuning the gratings as described in the article of B. Broberg et al, entitled "Widely tunable active Bragg reflector integrated lasers InGaAsP-InP", published in APPLIED PHYSICS LETTERS, Vol. 52, No. 16, Apr. 18, 1988, pages 1285-1287. A metal contact 52 is also provided on 10 the surface 54 of the substrate 28 opposite the surface 30.

On the side of the Bragg reflector 27 away from the gain section 22 is a lens 56 which is constructed to expand the width of the beam of light passing from the Bragg reflector 27. As shown, the lens 56 is a cylindrical groove 58 in the surface of the 15 waveguide layer 32. However, any other type of lens can be used which will perform the same function. On the side of the lens 56 away from the Bragg reflector 27 is an output grating 60 in the form of a plurality of spaced, parallel grooves in the surface of the waveguide layer 32 and extending transversely thereacross. The output grating 60 is wider than the Bragg reflector grating 27 in order to receive the wider beam of light from the lens 56. The period of the grooves in the output grating 60 is such as to diffract the beam of light passing therein out of the waveguide layer 32 as indicated by the arrow 62 in FIG. 3.

Figure 4:
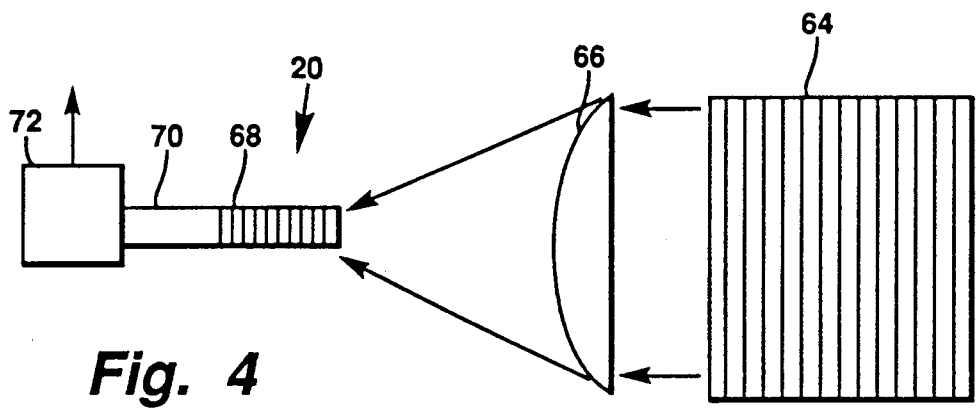
FIG. 4 is a top schematic view of the receiving portion of the optoelectronic termination of the present invention.

As shown in FIG. 4, the receiving section 20 includes an input grating 64, a waveguide lens 66 adjacent the input grating 64, a tuned waveguide grating filter 68 adjacent the lens 66, a gain section 70 adjacent the grating filter 68 and an optical detector 72 adjacent the gain section 70. The receiving section 20 is similar in construction to the transmitting section 18 in that it includes a substrate of a semiconductor material having a waveguide layer thereon. The input grating 64 and lens 66 are of the same construction as the output grating 60 and lens 56 except that light will be flowing in the opposite direction therethrough. The tuned waveguide grating filter 68 is similar to the grating 27 of the transmitting section 18 except that the period of the grooves is such as to provide filtering of the light and is completely transmissive to the light of the desired wavelength. The gain section 70 is similar in construction to the gain section 22 of the transmitting section 18. However, since the gain section 70 does not have reflectors at the ends thereof, light has only a single pass therethrough and is amplified by the gain section 70. The detector 72 can be any well known type of photodetector which will convert light into an electrical signal. The detector 72 can be of the same structure as the gain section 22 or can be a simple PN or PIN photodetector. The detector 72 is connected to circuitry in the integrated circuit which processes the signal from the detector 72 and feeds it to the appropriate portions of the integrated circuit.

In the transmitting section 18, the gain section 22 and phase control section 24 form a tuned diode laser in which light is generated when a voltage above the threshold of the device is applied thereacross. The gratings 26 and 27 provide feedback so as to achieve lasing action. The wavelength at which the gratings are reflective is varied by the injection of current thereacross which changes the effective refractive index of the guided wave in the grating region. The correct round trip phase relation for lasing action is controlled by the gain and phase sections 22 and 24 respectively. Since the grating 27 is partially transmissive, some of the generated beam of light will pas therethrough along the waveguide 32 to the lens 56. The lens will expand the beam of light and collimate it. The expanded, collimated beam of light then passes into the output grating 60 where it is deflected out of the waveguide 32 as indicated by the arrow 62. The angle at which light is reflected out of the waveguide 32 depends on the wavelength at which the tunable laser is operating. Thus, by tuning the laser the output angle can be changed. As will be explained later, the beam of light is directed out of the waveguide 32 at an angle to direct it into the receiving section 20 of the termination 16 of another integrated circuit. The electrical signals from various portions of the integrated circuit are applied to the gain section 22 to modulate the beam of light so that the modulated beam of light will transmit the signals 35 from the integrated circuit to another integrated circuit.

The receiving section 20 receives light from another integrated circuit which is directed into the input grating 64. The input grating 64 directs the incoming beam of light into and along the waveguide and through the lens 66. The lens 66 reduces the size of the beam and focuses it into the grating filter 68. The light passes through the filter 68 and into the gain section 70 where it is amplified by the light generated in the gain section 70. The amplified beam of light then passes into the detector 72 where it is converted to an electrical signal. The electrical signal is then processed, including demodulating the signal, and fed to the appropriate portions of the integrated circuit.

Figure 5:
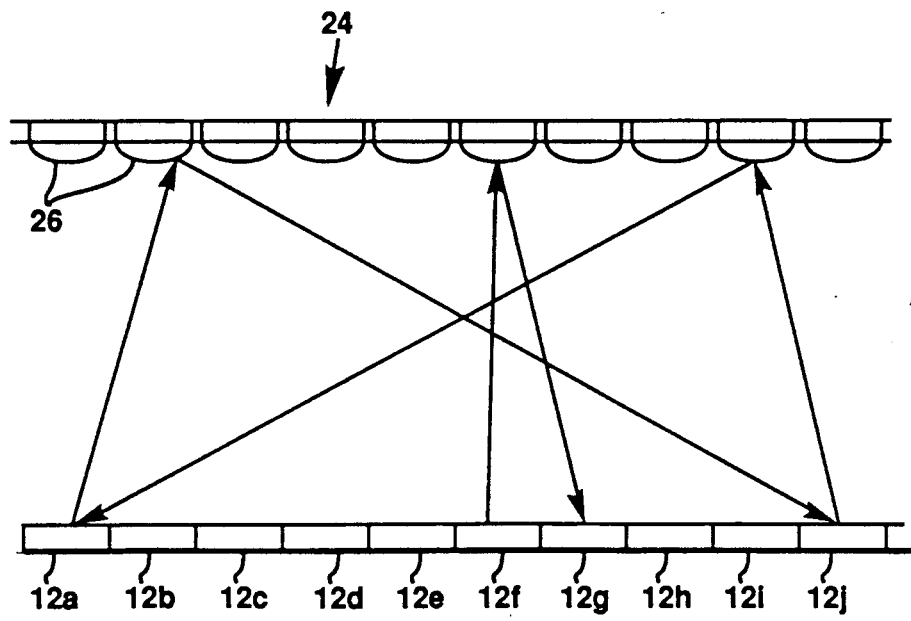
FIG. 5 is a schematic view showing a means for optically interconnecting integrated circuits in accordance with the present invention.

To optically transfer signals from one integrated circuit 10 to another in accordance with the present invention, a plurality of the circuits 10 may be mounted in side-by-side relation with their terminations 16 all facing in the same direction, as shown in FIG. 5. In FIG. 5 there is shown ten circuits 10a-10j so arranged. However, any number of the circuits can be connected in accordance with the present invention. Above the circuits 10a-10j is means for deflecting the light beams emitted from the transmitting sections 18 of each circuit to the receiving sections 20 of other circuits. Although a plane mirror could be used, it would have to be placed a long distance from the circuits and would make the assembly too large. As shown in FIG. 5, one type of reflector which can be placed much closer to the circuits 10a-10j is a reflective expanding telescope 74. The reflective expanding telescope 74 comprises a plurality of effective cylindrical reflectors 76, one for each circuit 10a-10j, mounted on the circuits 10a-10j so that the light beams emitted from the termination section 18 of each body 12 will be directed at one of the cylindrical reflectors 76. Each reflector 76 magnifies the deflection angle, thereby allowing light from one circuit to reach a second circuit over a relatively short path length as compared to a simple mirror. The angular magnification multiplies both the deflection and the diffraction angles and, at best, does not decrease the resolution.

As shown in FIG. 5, a beam of light emitted from the output grating 60 of a transmitting section 18 on circuit 10a can be directed at an angle which will impinge on a reflector 76 of the telescope 74 so as to be deflected to a receiving section 20 on the circuit 10j. Likewise, a beam of light emitted from a transmitting section 18 on circuit 10j can be directed at an angle which will be reflected by a reflector 76 to a receiving section 20 of circuit 10a. Similarly, a beam emitted from circuit 10f can be reflected to circuit 10g. Thus, by varying the angle that a beam of light is emitted from any transmitting section 18 of any of the circuits 10a-10j, the beam can be directed to the receiving section 20 of any of the other circuits 10a-10j. Also, since there are a plurality of terminations 16 on each circuit 10, the light beam from any one of the terminations 16 on any one circuit 10 can be directed to any one of the terminations 16 on any one of the other circuits 10. As previously described, the angle that the beam is emitted from its output grating can be varied by varying the wavelength at which the tunable laser is operating which can be achieved by varying the tuning of the laser. Thus, the optical interconnection system of the present invention provides for converting the output signals from an integrated circuit to an optical signal which is transmitted from one integrated circuit to another where the optical signal is converted back to an electrical signal.

Figure 6:
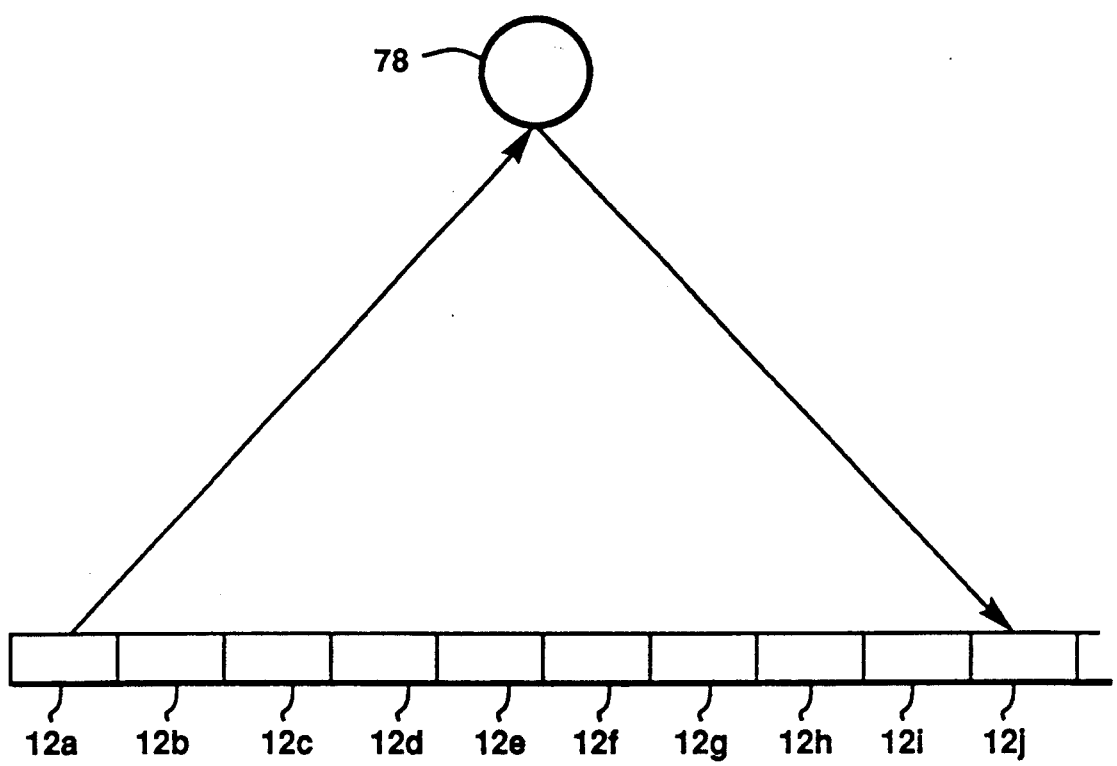
FIG. 6 is a schematic view showing another means for optically interconnecting integrated circuits.

Referring to FIG. 6, there is shown another form of a reflective expanding telescope which can be used in the present invention. The telescope shown in FIG. 6 is a single cylindrical reflector 78 mounted over the circuits 10a-10j so that the light beams emitted from the circuits is directed toward the reflector 78. The single reflector 78 acts similarly to the individual reflectors 76 to increase the angular deviation of a beam of light impinging on the surface thereof in a non-radial direction. With the single cylindrical reflector 78, each circuit 10 has a grating period chosen so that light is coupled out along a radius of the cylindrical reflector 78 at the center wavelength.

The spacing of the telescope from the circuits 10 depends on the wavelength of the light emitted from the terminations 16, the angle that the light can be deflected by the terminations 16, the number of circuits 10, the size of the circuits 10 and the magnification of the telescope. From the wavelength of the emitted light, the angle of deflection, and the number and size of the circuits, the distance that a flat deflector would have to be spaced from the circuits 10 can be determined using standard well known formulas. Once this distance is determined, the magnification of the telescope will determine the actual distance that the telescope must be spaced from the circuits to deflect light from any circuit to any other circuit. For example, for an emitted light at a wavelength of 8500 Angstroms, and with an emitter having a deflection angle of about 2.7°, a flat deflector, such as a mirror, would have to be spaced 60 centimeters (cm) from an array of 10 circuits each 1 cm square to achieve deflection of light from any one circuit to any other circuit in the array. Using a telescope having a 10× magnification, the telescope would be spaced 6 cm from the circuits.

The formation of integrated circuits and components thereof in materials such as silicon and Group III-V compounds is well known. The terminations are typically formed using Group III-V compounds. Each of the terminations 16 typically can be made by epitaxially depositing on a substrate or layer of GaAs the layers forming the various portions of the terminations using well known techniques such as those disclosed, for example, by Gary A. Evans et al, in an article entitled "Two Dimensional Coherent Laser Arrays Using Grating Surface Emission", published in the IEEE JOURNAL OF QUANTUM ELECTRONICS, Vol. 25, No. 6, June 1989, pages 1525-1538. The layers may be deposited by any well known method, such as chemical vapor phase epitaxy. The layers are then defined by removing portions of the layers to form the transmitting and receiving sections 18 and 20 and the various elements of each section using well known photolithographic and etching techniques. The various gratings are formed by etching the grooves in the appropriate layer using well known holographic, photolithographic and etching techniques. Metal contacts are deposited by vacuum evaporation or sputtering using well known techniques. The substrate having the termination 16 thereon is then mounted on and bonded to the body 12. Alternatively, the layers of the termination 16 may be epitaxially deposited directly on the body 12 using well known techniques for depositing such materials. The various elements of the termination 16 would then be formed in the deposited layers.

In integrated circuits where the body and the terminations are formed of dissimilar materials, for example silicon and Group III-V compounds respectively, provision can be made for the formation of the termination on the dissimilar body material. Techniques for heteroepitaxy of Group III-V compounds on silicon are well known, as shown for example by Fan et al in the Material Research Society Symposium Proceedings, Vol. 91, Apr. 21-23, 1987, pages 15-30, by Goodman et al in the Proceedings of the IEEE, Vol. 72, No. 7, July 1984, pages 850-866 and by Subbarao et al in the Technical Digest, GaAs IC Symposium, San Diego, CA, Oct. 22-25, 1989, pages 163-166.

Thus, there is provided by the present invention an optical interconnection for integrated circuits, each circuit having an optical termination. Each optical termination includes a transmitting section in which the output signals from the integrated circuit are converted to optical signals which are emitted from the integrated circuit and a receiving section for receiving an optical signal emitted from another integrated circuit. Means are provided for reflecting the optical signal from one integrated circuit to another integrated circuit. In each integrated circuit, a plurality of electrical signals can be applied to a single optical signal using muliplexers/demultiplexers so that one optical termination can achieve the same function as a plurality of electrical terminations. When an optical signal containing the information from a plurality of electrical signals is received by the receiving section of an optical termination, it is covered back to the plurality of electrical signals using multiplexers/demultiplexers and fed into the receiving integrated circuit. Thus, the optical interconnection of the present invention requires a fewer number of terminations to achieve the same function as a large number of electrical terminations.

What is claimed is:
1. An integrated circuit comprising:
   a body of a semiconductor material;
   electrical components in said body and electrically connected together in a desired electrical circuit;
   a termination on said body, said termination including an optical transmitting section and an optical receiving section;
   said transmitting section including means for converting an output electrical signal of the circuit to an output optical signal, means for emitting the optical signal as a beam from the transmitting section out of the body and means for varying the angle that the beam of light is emitted from the transmitting section; and
   said receiving section including means for receiving an input optical signal from outside the body in the form of a light beam and means for converting the input optical signal to an input electrical signal which is fed to the circuit.

2. The integrated circuit of claim 1 in which the transmitting section of the termination includes means for generating a beam of light, means for modulating the beam of light by the output electrical signal, and means for directing the modulated beam of light out of the transmitting section.

3. The integrated circuit of claim 2 in which the transmitting section includes a waveguide, means for generating a beam of light in the waveguide, and an output grating along the waveguide for directing the beam of light out of the waveguide.

4. The integrated circuit of claim 3 in which the means for generating the light in the waveguide is a tunable laser diode.

5. The integrated circuit of claim 4 including gratings on the waveguide at each end of the laser diode, said gratings being capable of reflecting the light generated in the waveguide therebetween and one of the gratings being partially transmissive to allow some of the light to flow along the waveguide to the output grating.

6. The integrated circuit of claim 1 in which the receiving section includes an input grating for receiving a beam of light, means for amplifying the beam of light received through the input grating, and a photodetector for converting the amplified beam of light to an electrical signal.

7. The integrated circuit of claim 6 in which the receiving section includes a waveguide and the input grating, amplifier and photodetector are along the waveguide.

8. The integrated circuit of claim 7 in which the transmitting section includees a waveguide, means for generating a beam of light in the waveguide and an output grating along the waveguide for directing the beam of light out of the waveguide.

9. The integrated circuit of claim 8 in which the means for generating the light in the waveguide of the transmitting section is a tunable laser diode.

10. The integrated circuit of claim 9 including gratings on the waveguide of the transmitting section at each end of the laser diode, said grating being capable of reflecting the light generated in the waveguide therebetween and one of the gratings being partially transmissive to allow some of the light to flow along the waveguide to the output grating.

11. The integrated circuit of claim 10 in which the transmitting section and the receiving section are adjacent each other and are arranged along an edge of the body.

12. The integrated circuit of claim 11 in which the transmitting section and receiving section extend substantially parallel to the edge of the body.

13. The integrated circuit of claim 12 including a plurality of the terminations spaced along said edge of the body.

14. An optical interconnection for integrated circuits comprising:

a plurality of semiconductor bodies each having an integrated circuit therein and at least one termination for each of the integrated circuits;

each of said terminations including an optical transmitting section and an optical receiving section;

the transmitting section including means for converting an output electrical signal of the integrated circuit to an output optical signal in the form of a beam, means for emitting the beam from the body and means for varying the angle at which the output optical signal is emitted from the transmitting section;

the receiving section including means for receiving an input optical signal in the form of a beam, and means for converting the input optical signal to an input electrical signal which is fed to the integrated circuit;

said bodies being mounted adjacent each other with the output optical signals being emitted in the same direction; and means over said bodies for reflecting an output optical signal from the transmitting section of one of the bodies to the receiving section of another one of the bodies so that varying the angle that the beam is emitting from the transmitting section the particular body to which the beam is reflected can be controlled.

15. The optical interconnection system of claim 14 in which the means for reflecting the optical signal is a reflective expanding telescope.

16. The optical interconnection system of claim 15 in which the reflective expanding telescope comprises a plurality of individual effective cylindrical reflectors mounted in side-by-side relation over the bodies.

17. The optical interconnection system of claim 16 in which the number of reflectors in the telescope is equal to the number of bodies being interconnected.

18. The optical interconnection system of claim 17 in which the reflective expanding telescope comprises a single cylindrical reflector mounted over the bodies.

* * * * *